United States Patent
Assmann

(10) Patent No.: US 7,317,940 B2
(45) Date of Patent: Jan. 8, 2008

(54) MRT APPARATUS, METHOD AND COMPUTER PROGRAM PRODUCT FOR DETERMINING THE SPEED OF A FLOWING MEDIUM

(75) Inventor: Stefan Assmann, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 632 days.

(21) Appl. No.: 10/726,121

(22) Filed: Dec. 2, 2003

(65) Prior Publication Data

US 2004/0167394 A1    Aug. 26, 2004

(30) Foreign Application Priority Data

Dec. 2, 2002   (DE) ............................... 102 56 209

(51) Int. Cl.
*A61B 5/05*   (2006.01)

(52) U.S. Cl. .................. 600/419; 600/410; 600/411; 600/413; 600/504; 324/307; 324/306; 324/309; 382/299; 382/268; 382/274; 382/264; 345/600; 345/604; 345/605

(58) Field of Classification Search .............. 600/419, 600/410, 411, 413, 504; 324/306–309; 382/268, 382/299, 264, 274; 345/600, 604, 605
See application file for complete search history.

(56) References Cited

U.S. PATENT DOCUMENTS

| 4,609,872 | A | * | 9/1986 | O'Donnell | .................. 324/306 |
| 6,031,374 | A | | 2/2000 | Epstein et al. | |
| 6,317,620 | B1 | | 11/2001 | Ho et al. | |
| 6,922,580 | B2 | * | 7/2005 | DeMeester et al. | ......... 600/413 |

OTHER PUBLICATIONS

"Techniken der Magnetresonanz-Angiographie," Laub et al., electromedica. vol. 66, No. 2, pp. 62-70 (1998).

* cited by examiner

*Primary Examiner*—Brian L. Casler
*Assistant Examiner*—Parikha S. Mehta
(74) *Attorney, Agent, or Firm*—Schiff Hardin LLP

(57) ABSTRACT

In a method for automatic determination of the actual speed interval of a flowing medium in flow measurements in magnetic resonance imaging, an overview image (localizer) is acquired displayed on a screen, a scout flow measurement is performed by acquiring an image series during a motion cycle at a pre-determined speed interval in a tissue-area to be measured, the peak speed of the medium in the tissue area to be measured is determined on the basis of the scout flow measurement, an optimized flow measurement is performed by acquiring the same images from the acquired image series on the basis of the determined peak speed, and the speed-resolved tissue area obtained by means of the optimized flow measurement is displayed on the screen.

10 Claims, 4 Drawing Sheets

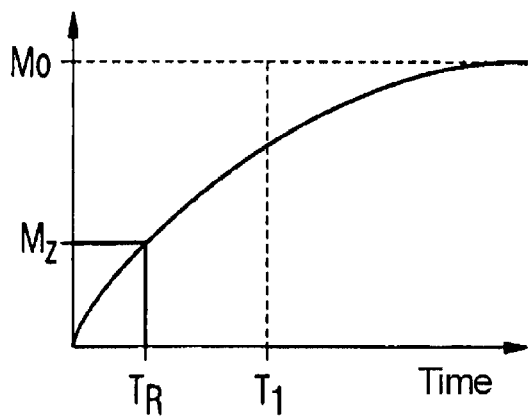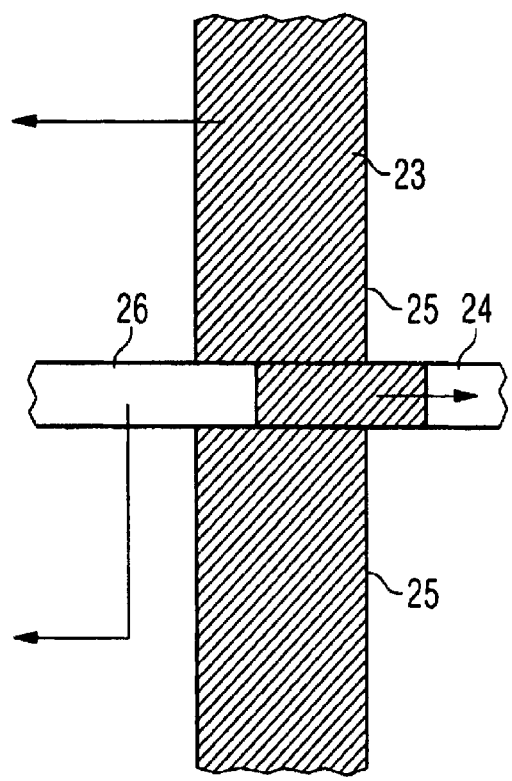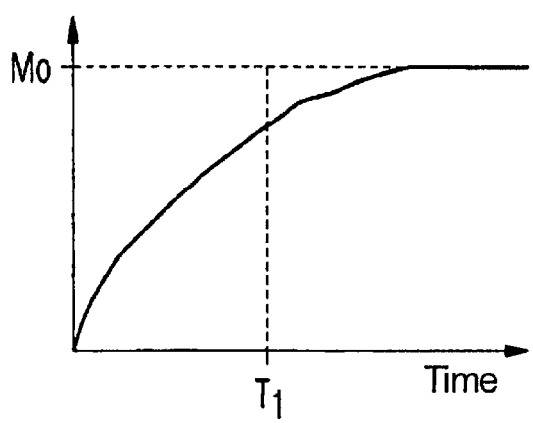

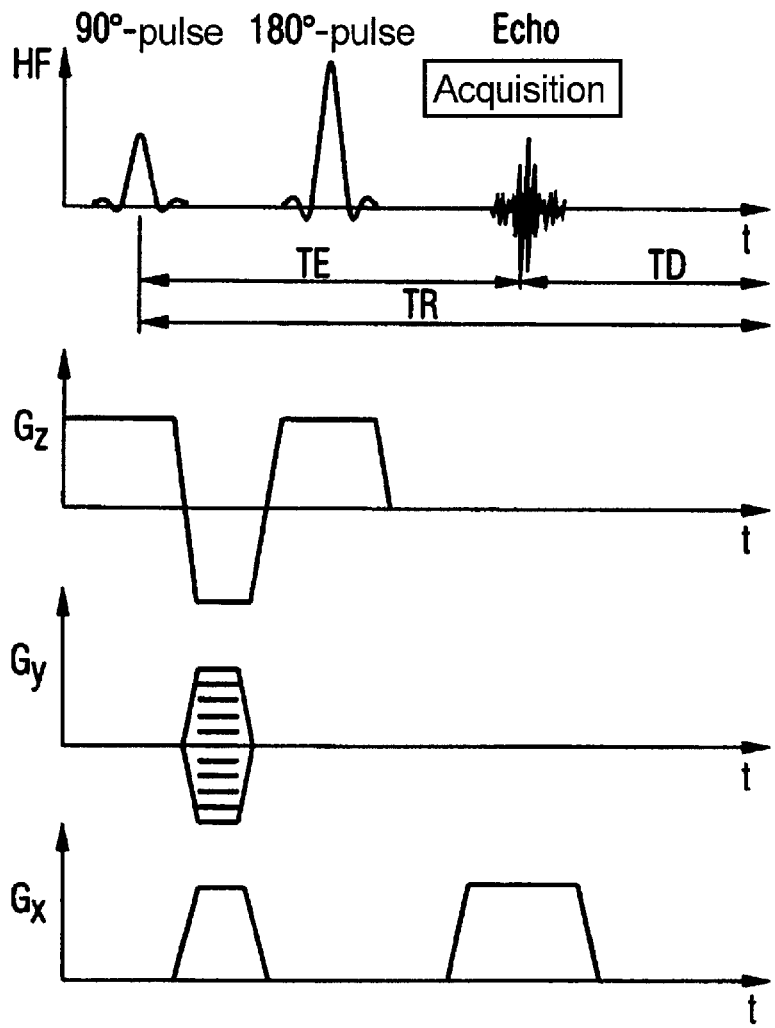
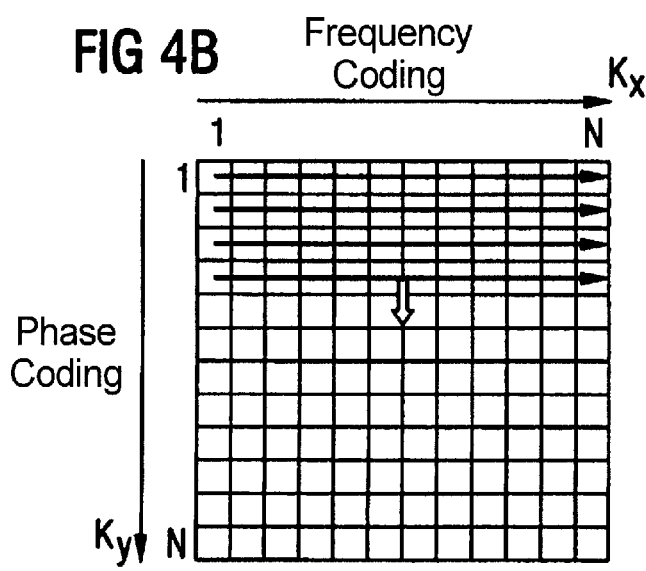

MRT APPARATUS, METHOD AND COMPUTER PROGRAM PRODUCT FOR DETERMINING THE SPEED OF A FLOWING MEDIUM

BACKGROUND OF THE INVENTION

1. Field of the Invention

The present invention generally involves magnetic resonance tomography, or MRT, as applied in medicine for examining patients. The present invention relates especially to a process for improving flow measurements as they are performed in magnetic resonance tomography, for example, to show vascular systems that have blood flowing through them.

2. Description of the Prior Art

MRT is based on the physical phenomenon of nuclear magnetic resonance and has been used successfully as an imaging modality for over 15 years in medicine and biophysics. In this examination method, an object is exposed to a strong, constant magnetic field. In the process, the nuclear spins of the atoms in the object, which were previously randomly oriented, become aligned. Radio-frequency energy then can excite these "aligned" nuclear spins into a certain oscillation. This oscillation generates the actual MRT measurement signal, which is acquired using suitable receiver coils. By using non-homogenous magnetic fields, generated by gradient coils, signals from the measurement object can be spatially coded in all three spatial directions, which, in general, are called "spatial coding".

The recording of data in MRT is done in k-space (frequency domain). The MRT-image in the image domain is linked using Fourier transformation to the MRT-data in k-space. The spatial coding of the object that spans k-space is done using the aforementioned gradients in all three spatial directions. In the process, a distinction is made between the slice or layer (specifies the recorded slice in the object, usually the z-axis), the frequency coding (specifies a direction in the slice, usually the x-axis) and the phase coding (determines the second dimension within the slice, usually the y-axis). Furthermore, by phase coding along the z-axis, the selected slice can be subdivided into sub-slices.

Thus, initially a slice is selectively excited, for example, in the z-direction, and phase-coding is possibly performed in the z-direction. The coding of the spatial information in the slice is done through a combined phase and frequency coding using the two aforementioned orthogonal gradient fields, which, in the example of a slice excited in the z-direction, are generated by the aforementioned gradient fields in the x- and y-directions.

A possible form for recording the data in an MRT measurement is shown in FIGS. 4A and 4B. The sequence applied is a spin-echo sequence. In this sequence, the magnetization of the spins is made in the x-y plane by a 90° excitation pulse. In the course of time (½ $T_E$; $T_E$ is the echo time), a dephasing of the magnetization portions, which together form the transverse magnetization in the x-y plane $M_{xy}$, occurs. After a certain time (e.g. ½ $T_E$), a 180° pulse is emitted in the x-y plane such that the dephased magnetization components are reflected without changing the precession direction and precession speed of the individual magnetization portions. After an additional time period ½ $T_E$, the magnetization components point in the same direction again, i.e. a regeneration of the traverse magnetization results (called "rephasing"). The complete regeneration of the transverse magnetization is called spin-echo.

In order to measure a corporate slice of the object to be examined, the imaging sequence is repeated N-times for different values of the phase coding gradients, e.g. $G^Y$. The time interval of the respective excitation producing HF-pulses is called the repetition time TR. The magnetic resonance signal (spin-echo signal) is also scanned, digitized, and stored, in the presence of the read-out gradients $G^X$, N-times at equivalent time intervals $\Delta t$ in each sequence pass by the $\Delta t$-clocked ADC (Analog Digital Converter). In this way, according to FIG. 4B, a numerical matrix that is created line-by-line (matrix in the k-space or k-matrix) with N×N data points. From this dataset, using a Fourier transformation, a MR-image of the slice in question can be directly reconstructed with a resolution of N×N pixels (a symmetrical matrix with N×N points is only one example, asymmetric matrices also can be generated).

For speed-indicating flow measurements in magnetic resonance tomography, either the progression of the average speed of the flowing medium in a certain vessel can be determined during a movement cycle (breathing, heart movement) or the speed distribution in the cross-section of the vessel region that is of interest and in which a fluid is flowing through can be determined at a defined point in time of the movement. Of great interest, for example, is the speed progression (curve) of the blood in the aorta during a cardiac cycle (from systole to systole).

For such measurements the imaging slice typically oriented vertically to the vessels to be displayed, and an additional phase coding gradient is generated in the direction of the flowing medium (blood, secretions, etc.). The additional (phase-coding) gradient in the flow direction is necessary to be able to assign a defined speed to each voxel of the flowing medium on the basis of the intensity of the resonance signal of the nuclear spin it contains. This allocation normally takes place after the actual measurement in a software-supported post-processing by the user on the screen. Prior to the actual speed resolution measurement an overview image (localizer) is acquired. The user manually marks the region of interest ROI in the localizer in the slice (for example using a mouse) and begins the measurement of a series of images (typically 20 images per cycle), whereby the marked ROI is correspondingly propagated and reproduced by means of segmenting algorithms.

After the measurement of the image series the users begins an intensity analysis in the marked region by means of which either the speed is determined over the entire ROI of each image of the series, or a speed profile (curve) is created in the form of a gray-scale distribution of each image of the series.

The flow in the recorded images can now be displayed by means of time sequence, e.g. at a frequency of 20 images per second, on the screen as a movie.

The speed-dependency of the nuclear resonance signal of the flowing material is based on the different distribution of saturated as well as completely relaxed or unrelaxed spins of the perfused vessel of the layer to be displayed. To obtain an optimum resolution of the speed or of the speed distribution in the vessel, the present speed interval (velocity encoding, VENC) of the flowing material should be exactly known, in order to be able to perform an optimized speed coding by means of the speed coding gradients to be generated created dependent on the layer thickness, the flip angle and further measuring or sequence parameters.

In the present state of the art the user (in general the physician) has to estimate the flow speed of, for example, blood in a vessel to be measured. The flow speed varies quite greatly dependent on the anatomical position. For example the maximum speed of the blood in the aorta differs greatly from that in the carotids or in the stenotic vessel regions. The user therefore sets empirical values which—to cover in any event the entire speed region—as a rule define too large an interval. The result is a speed resolution tat is below optimum.

SUMMARY OF THE INVENTION

An object of the present invention is to provide a method for optimizing the speed resolution of flow measurements in magnetic resonance imaging.

In accordance with the invention, the above object is achieved by a method for automatic determination of the actual speed interval of a flowing medium in flow measurements in magnetic resonance imaging, including acquiring a localizer of a selected area of a living subject to be examined, displaying the localizer on a screen, performing a scout flow measurement by acquiring a series of images during a motion cycle at a predefined speed interval in a tissue region of the selected area to be measured, determining the peak speed of the medium in the tissue region to be measured on the basis of the scout flow measurement, performing of an optimized flow measurement by acquiring corresponding images from the acquired series of images on the basis of the determined peak speed, and displaying the speed resolved tissue region, obtained by means of the optimized flow measurement, on the screen.

In accordance with the invention the optimized flow measurement occurs automatically immediately after the scout flow measurement.

To make sure that the roughly determined value of the peak speed in the scout measurement lies in the range of the actual peak speed, a safety margin can be added to the roughly determined peak value.

The safety margin to be added amounts, in accordance with the invention, to 10% of the roughly determined peak speed.

In accordance with the invention the speed resolution measurement of vessels is a function of a motion cycle of the object to be examined. Such a cycle can be the time of a breathing cycle, a heartbeat cycle or other forms of motion. In the method a good resolution of the series of images is given at approximately 20 images per cycle.

In accordance with the invention the speed resolved display of the tissue region (ROI) can occur in two ways: 1) The mean speed of the area is displayed in the measured tissue region of an image of the image series, and 2) The speed profile of the range is displayed in the measured tissue region of an image of the image series.

The tissue region to be measured can be manually marked by the user. In the inventive method more than one tissue area can be marked.

The above object also is achieved in accordance with the present invention by a magnetic resonance tomography device operable to perform the above-described method.

The above object also is achieved in accordance with the present invention by a computer software product which implements a method as described above and that runs on a computer device associated with a magnetic resonance tomography device.

DESCRIPTION OF THE DRAWINGS

FIG. 3A illustrates, in a sectional view, an excitation layer perpendicular to a vessel that as blood flowing through it.

FIG. 3B schematically illustrates the saturation progression of the longitudinal magnetization of the excitation layer.

FIG. 3C schematically illustrates the saturation progression of the magnetization of the blood flowing into the excitation layer.

FIG. 4A schematically illustrates the time progression of the gradient pulse flow functions of a spin-echo sequence.

FIG. 4B schematically illustrates the time scanning of the k-matrix in a spin-echo sequence according to FIG. 4A.

DESCRIPTION OF THE PREFERRED EMBODIMENTS

Figure 1:
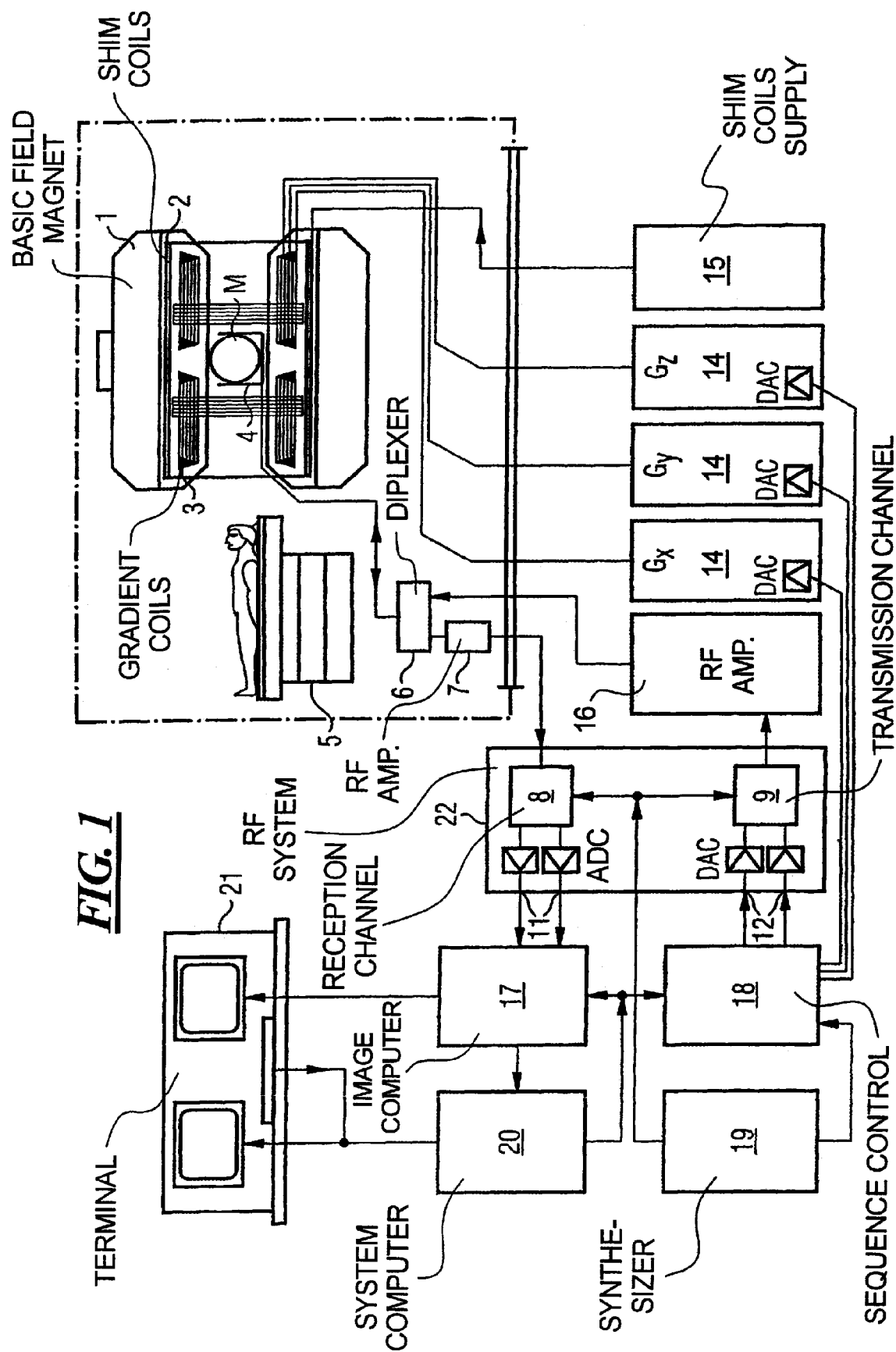
FIG. 1 illustrates schematically illustrates a magnetic resonance tomography device operable in accordance with the invention.

FIG. 1 is a schematic block diagram of a magnetic resonance tomography device with which optimized flow measurements according to the present invention are possible. The components of the magnetic resonance tomography device correspond to those of a conventional tomography device, with operational differences as described below. A basic field magnet 1 generates a strong magnetic field, which is constant in time, for the polarization or alignment of the nuclear spins in the examination region of an object, such as, for example, a part of a human body to be examined. The high homogeneity of the basic magnetic field required for the magnetic resonance measurement is defined in a spherical measurement volume M, into which the parts of the human body to be examined are brought. In order to satisfy the homogeneity requirements and especially for the elimination of time-invariant influences, shim-plates made of ferromagnetic material are mounted at suitable positions. Time-variable influences are eliminated by shim coils 2, which are controlled by a him-current supply 15.

In the basic magnetic field 1, a cylinder-shaped gradient coil system 3 is used, which consists of three windings. Each winding is supplied with current by an amplifier 14 in order to generate a linear gradient field in the respective directions of the Cartesian coordinate system. The first winding of the gradient field system 3 generates in a gradient $G_x$ in the x-direction, the second winding generates a gradient $G_y$ in the y-direction, and the third winding generates a gradient $G_z$ in the z-direction. Each amplifier 14 contains a digital-analog converter, which is controlled by a sequence control 18 for the generation of gradient pulses at proper times.

Within the gradient field system 3, a radio-frequency antenna 4 is located which converts the radio-frequency pulses emitted by a radio-frequency power amplifier 30 into a magnetic alternating field in order to excite the nuclei and align the nuclear spins of the object to be examined or the region of the object to be examined. From the radio-frequency antenna 4, the alternating field emerging from the preceding nuclear spins, i.e. usually the nuclear spin echo signals brought about by a pulse sequence from one or more high-frequency pulses and one or more gradient pulses, is converted into a voltage that is supplied via an amplifier 7 to a radio-frequency receiver channel 8 of a radio-frequency system 22. The radio-frequency system 22 contains, furthermore, a transmission channel 9, in which the radio-frequency pulses are generated for the excitation of the nuclear magnetic resonance. In the process, the respective radio-frequency pulses based on a pulse sequence specified by the system computer 20 in the sequence control 18 are represented digitally as complex numbers. This numerical sequence is supplied as real and imaginary parts via responsive inputs 12 to a digital-analog converter in the high-frequency system 22 and from there to a transmission channel 9. In the transmission channel 9, the pulse sequences are modulated with a radio-frequency carrier signal, having a base frequency corresponding to the resonance frequency of the nuclear spins in the measurement volume.

The conversion from transmitting to receiving operation is done via a diplexer 6. The radio-frequency antenna 4 emits the radio-frequency pulse to excite the nuclear spin into the measurement volume M and scans the resultant echo signals. The correspondingly obtained magnetic resonance signals are demodulated in the receiving channel 8 of the radio-frequency system 22 in a phase-sensitive manner, and are converted via respective analog-digital converter into a real part and an imaginary part of the measurement signal. Using an imaging computer 17, an image is reconstructed from the measurement data obtained in his way. The administration of the measurement data, the image data and the control programs is done via the system computer 20. Based on a specification with control programs, the sequence control 18 controls the generation of the desired pulse sequences and the corresponding scanning of k-space. In particular, the sequence control 18 controls the switching of the gradients at appropriate times, the transmission of the radio-frequency pulses with a defined phase and amplitude, and the reception of the magnetic resonance signals. The time basis for the radio-frequency system 22 and the sequence control 18 is furnished by a synthesizer 19. The selection of appropriate control programs for generating an MR image and the display of the generated nuclear spin image is done via a terminal (console) 21, which contains a keyboard and one or more screens.

The present invention takes advantage of the fact that it is possible with the system computer 20 or with the image computer 17 to automatically determine the maximum speed of the flow in a limited speed-coded area of an MRI flow image. The voxels appear to be of a higher speed than areas of higher signal intensity.

Figure 2A:
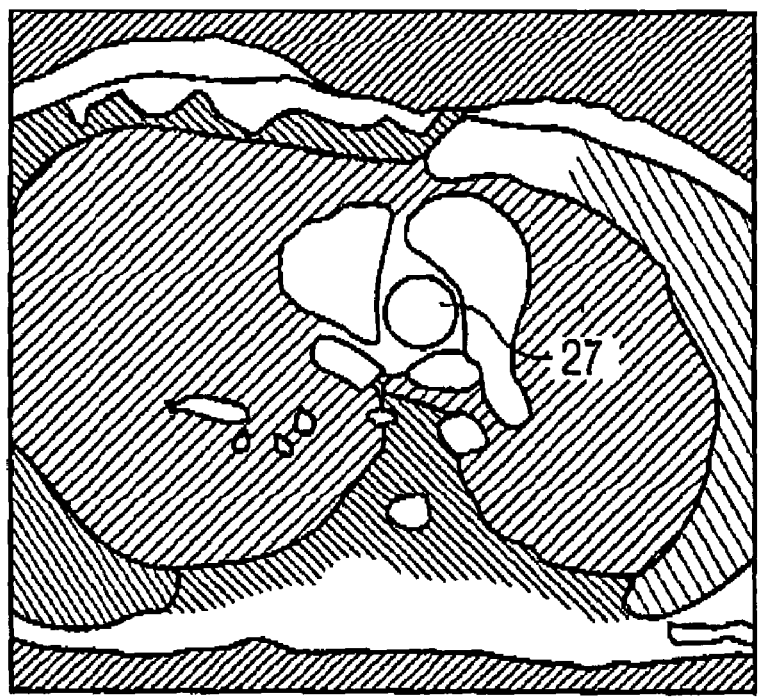
FIG. 2a illustrates a localizer in the form of a transverse cross-section of the aorta in the mediastinum.
Figure 2B:
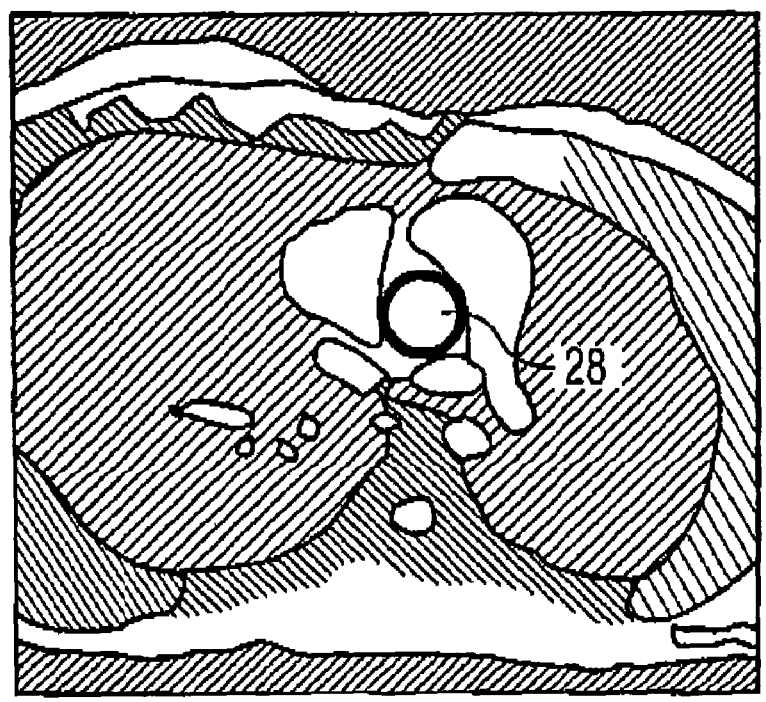
FIG. 2b illustrates the localizer in which the region for the speed analysis (cross-section of the aorta) is characterized as a circular ROI (region of interest).

This effect will be briefly explained using FIGS. 2A, 3B and 3C.

As already mentioned, for a magnetic resonance flow measurement, the image slice typically is oriented perpendicularly to the vessels that are to be depicted. In FIG. 3A, an excitation layer 23 of this type is shown schematically. In order to produce an optimal contrast between the stationary tissue and the vessel 24, in which the spins of the stationary tissue 23 are saturated as greatly as possible, the repetition time TR is selected to be as short as possible. When the spins are flipped in rapid succession, there is not enough time for the magnetization to build up again completely in the longitudinal direction. This means that for excitations that follow each other in rapid succession, i.e. during a very brief time period TR, according to FIG. 3B only one small magnetization vector $M_z$ is regenerated in the longitudinal direction, which also generates only a few signals after the flipping of the RF-pulse. In this way, the stationary tissue 23 appears very dark in the image. This is called a saturation of the spin.

The spins of the blood 26, which flows through the vessels 23 to be displayed, are only excited if the blood 26 flows into the excitation layer 23. Since prior to entering into the excitation layer 23, the blood still has not experienced any RF-excitation, complete (relaxed) magnetization of the spins of the blood $M_0$ is available when the blood enters the layer (see FIG. 3C). This has the consequence that blood 26 flowing into the layer, and thus the vascular system through which the blood flows is shown brighter in the MRT-image than the surrounding stationary tissue 23.

By placing a (phase-) coding gradient in the flow direction, the flowing blood can also be differentiated (coded). The gradient causes an accelerated dephasing (relaxation) of the magnetization; the longer the blood is exposed to the gradient field, the greater the dephasing that occurs and the weaker the magnetic resonance signal. This means that blood flowing quickly exhibits less relaxation and therefore in the later image has a stronger intensity. Between the dephasing that becomes manifested in a defined phase shift φ relative to the magnetization of static material, the speed-coded gradients, the repetition time and the absolute speed of the blood, a mathematical relation exists on the basis of which the speed values of the flowing material can be determined in the ROI.

The inventive method proceeds in general as follows. First a localizer (overview image) is acquired, which ideally includes a transverse slice in the (blood) vessel to be measured in or through which the flow is to be measured (for example the aorta). Using this image the cross-section of the vessel is manually marked as a region of interest (ROI) 28 using appropriate graphics software, e.g. on the screen by means of a circle using a mouse. On the basis of the marking of the ROI 28 a scout flow measurement is started, with the speed interval (VENC) being set so high that the peak speed (maximum speed) of the flow in the marked vessel section in any event lies within the speed interval (e.g. 300 cm/sec). During or immediately after the data acquisition the actual peak speed (VENC value) in the ROI 28 on the basis of the intensity values is roughly determined by the system computer 20 or image computer 17 and stored therein. The speed resolution of the scout measurement is not yet optimum. An optimum speed resolution occurs automatically after the scout measurement by means of the actual flow measurement, the measuring range of which is now limited by the roughly determined VENC value plus or minus (±) a safety margin (approximately 10%). As a result in the ROI 28 an optimum speed resolution of the perfused vessel can be achieved with the total image series.

In determination of the speed via the total ROI 28 of a flow image the ROI 28 of the images with the slowest flow has the least intensity (black), the ROI 28 of the images with the fastest flow has the most intensity (white); images with speed intermediate values in the ROI 28 receive the corresponding gray-value of a gray-value scale.

In the display of the speed profile within any ROI 28, the optimum speed-resolution image in each ROI 28 has a gray-value distribution so that stationary areas appear black, areas with maximum speed appear white and areas with intermediate speed values appear with corresponding gray-value shadings.

This method of automated-optimized speed-resolution flow measurement in magnetic resonance imaging has on the one hand the advantage that the user does not have to rely on empirical values that are to be entered and thus errors in estimating the speed interval do not occur. Additionally, by automating the workflow a repetition of measurement (as was conventionally necessary) is avoided, which minimizes the length of stay of the patient in the MRI device.

Although modifications and changes may be suggested by those skilled in the art, it is the intention of the inventor to embody within the patent warranted hereon all changes and

I claim as my invention:

1. A method for automatically determining a speed of a flowing medium in a magnetic resonance tomography flow measurement, comprising the steps of:
   acquiring an overview magnetic resonance image of a selected area of a living subject;
   displaying said overview image on a screen;
   performing a scout flow measurement by acquiring a magnetic resonance image series of said subject during a motion cycle of said subject at a predetermined speed interval in a tissue area within said overview image, said tissue area containing a flowing medium;
   from said scout flow measurement, automatically determining a peak speed of said flowing medium in said tissue area;
   performing an optimized flow measurement by acquiring respective images, corresponding to selected images in said image series, dependent on said peak speed; and
   generating and displaying on said screen a speed-resolved image including said tissue area using said peak speed to set a grey scale range in said speed-resolved image, obtained by said optimized flow measurement in a display format selected from the group consisting of a speed-resolved image of said tissue area encompassing an average speed of said flowing medium and a speed resolved image of said tissue area together with a generated speed profile of said flowing medium in said tissue area.

2. A method as claimed in claim 1 comprising automatically performing said optimized flow measurement immediately after performing said scout flow measurement.

3. A method as claimed in claim 1 comprising adding a safety margin to said determined peak speed.

4. A method as claimed in claim 3 comprising employing a value as said safety margin that is 10% of said peak speed.

5. A method as claimed in claim 1 employing a time, as said motion cycle, selected from the group consisting of a breathing cycle of said subject and a cardiac cycle of said subject.

6. A method as claimed in claim 1 comprising acquiring said image series in said scout flow measurement at approximately 20 images per motion cycle.

7. A method as claimed in claim 1 comprising manually marking said tissue area in said overview image displayed on said screen.

8. A method as claimed in claim 1 comprising designating a plurality of tissue areas within said overview image, and displaying a speed-resolved image for each of said plurality of tissue areas.

9. A magnetic resonance imaging device comprising:
   a magnetic resonance scanner adapted to receive a subject therein;
   a control computer connected to said magnetic resonance scanner;
   a display screen connected to said control computer; and
   said control computer being programmed to operate said magnetic resonance scanner to acquire an overview magnetic resonance of a selected area of a living subject, and to display said overview image on a screen, and to perform a scout flow measurement by causing said magnetic resonance scanner to acquire a magnetic resonance image series of said subject during a motion cycle of said subject at a predetermined speed interval in a tissue area within said overview image, said tissue area containing a flowing medium, and to automatically determine from said scout flow measurement, a peak speed of said flowing medium in said tissue area, and to perform an optimized flow measurement by acquiring respective images, corresponding to selected images in said image series, dependent on said peak speed, and to generate and display a speed-resolved image including said tissue area, using said peak speed to set a grey scale range in said speed-resolved image obtained by said optimized flow measurement on a screen in a display format selected from the group consisting of a speed-resolved image of said tissue area encompassing an average speed of said flowing medium and a speed-resolved image of said tissue area together with a generated speed profile of said flowing medium in said tissue area.

10. A computer-readable medium encoded with a data structure, said computer-readable medium being loadable into a control computer of a magnetic resonance imaging apparatus, said magnetic resonance imaging apparatus including a magnetic resonance scanner operated by said control computer, and a display screen connected to said control computer, and said data structure causing said control computer to:
   acquire an overview magnetic resonance image of a selected area of a living subject;
   display said overview image on a screen;
   perform a scout flow measurement by acquiring a magnetic resonance image series of said subject during a motion cycle of said subject at a predetermined speed interval in a tissue area within said overview image, said tissue area containing a flowing medium;
   from said scout flow measurement, determine a peak speed of said flowing medium in said tissue area;
   perform an optimized flow measurement by acquiring respective images, corresponding to selected images in said image series, dependent on said peak speed; and
   generate a display on said screen of a speed-resolved image including said tissue area, using said peak speed to set a grey scale range in said speed-resolved image, wherein the speed-resolved image is obtained by said optimized flow measurement, and wherein the display is generated in a display format selected from the group consisting of a speed-resolved image of said tissue area encompassing an average speed of said flowing medium and a speed-resolved image of said tissue area together with a generated speed profile of said flowing medium in said tissue area.

* * * * *